United States Patent
Hung et al.

(10) Patent No.: US 9,685,552 B2
(45) Date of Patent: Jun. 20, 2017

(54) SILICON CARBIDE FIELD EFFECT TRANSISTOR

(71) Applicant: Hestia Power Inc., Hsinchu (TW)

(72) Inventors: Chien-Chung Hung, Hsinchu (TW); Cheng-Tyng Yen, Hsinchu (TW); Hsiang-Ting Hung, Hsinchu (TW); Chwan-Ying Lee, Hsinchu (TW)

(73) Assignee: Hestia Power Inc., Hsinchu (TW)

( * ) Notice: Subject to any disclaimer, the term of this patent is extended or adjusted under 35 U.S.C. 154(b) by 0 days.

(21) Appl. No.: 14/591,470

(22) Filed: Jan. 7, 2015

(65) Prior Publication Data
US 2016/0126346 A1   May 5, 2016

(30) Foreign Application Priority Data
Nov. 3, 2014   (TW) .............................. 103138027 A

(51) Int. Cl.
| | | |
|---|---|---|
| *H01L 29/78* | (2006.01) | |
| *H01L 29/08* | (2006.01) | |
| *H01L 29/10* | (2006.01) | |
| *H01L 29/16* | (2006.01) | |
| *H01L 29/423* | (2006.01) | |
| *H01L 21/04* | (2006.01) | |
| *H01L 29/66* | (2006.01) | |

(52) U.S. Cl.
CPC ........ *H01L 29/7813* (2013.01); *H01L 21/046* (2013.01); *H01L 29/086* (2013.01); *H01L 29/0865* (2013.01); *H01L 29/1095* (2013.01); *H01L 29/1608* (2013.01); *H01L 29/4236* (2013.01); *H01L 29/66068* (2013.01)

(58) Field of Classification Search
CPC ........... H01L 29/1608; H01L 29/66068; H01L 29/1602; H01L 29/7802; H01L 29/6606; H01L 29/4236; H01L 29/1095; H01L 29/0865; H01L 29/086; H01L 21/046
See application file for complete search history.

(56) References Cited

U.S. PATENT DOCUMENTS

| | | | | |
|---|---|---|---|---|
| 2002/0167011 A1* | 11/2002 | Kumar | ................ | H01L 29/8083 257/77 |
| 2007/0114599 A1* | 5/2007 | Hshieh | ................ | H01L 29/0634 257/330 |
| 2008/0197381 A1* | 8/2008 | Kawashima | ........ | H01L 29/7397 257/255 |

(Continued)

*Primary Examiner* — Allen Parker
*Assistant Examiner* — Long H Le
(74) *Attorney, Agent, or Firm* — Muncy, Geissler, Olds & Lowe, P.C.

(57) ABSTRACT

A silicon carbide field effect transistor includes a silicon carbide substrate, an n-type drift layer, a p-type epitaxy layer, a source region, a trench gate, at least one p-type doped region, a source, a dielectric layer and a drain. The p-type doped region is disposed at the n-type drift layer to be adjacent to one lateral side of the trench gate, and includes a first doped block and a plurality of second doped blocks arranged at an interval from the first doped block towards the silicon carbide substrate. Further, a thickness of the second doped blocks does not exceed 2 um. Accordingly, not only the issue of limitations posed by the energy of ion implantation is solved, but also an electric field at a bottom and a corner of the trench gate is effectively reduced, thereby enhancing the reliability of the silicon carbide field effect transistor.

14 Claims, 2 Drawing Sheets

(56) References Cited

U.S. PATENT DOCUMENTS

| | | | |
|---|---|---|---|
| 2009/0114969 A1* | 5/2009 | Suzuki | H01L 29/0619 257/301 |
| 2009/0134402 A1* | 5/2009 | Yatsuo | H01L 21/0465 257/77 |
| 2009/0261350 A1* | 10/2009 | Yamamoto | H01L 29/0623 257/77 |
| 2012/0049902 A1* | 3/2012 | Corona | H01L 21/02381 327/109 |
| 2012/0080728 A1* | 4/2012 | Malhan | H01L 29/0661 257/280 |
| 2013/0161736 A1* | 6/2013 | Hung | H01L 21/0475 257/330 |
| 2013/0175608 A1* | 7/2013 | Lee | H01L 29/66712 257/329 |

* cited by examiner

SILICON CARBIDE FIELD EFFECT TRANSISTOR

FIELD OF THE INVENTION

The present invention relates to a semiconductor device, and particularly to a silicon carbide field effect transistor.

BACKGROUND OF THE INVENTION

The breakdown voltage, one of the characteristics of a semiconductor power device, is designed towards targets of having a minimal conduction resistance, a low reverse leakage current and a fast switching speed, so as to reduce a conduction loss as well as switching loss. Having a wide bandgap (Eg=3.26 eV), a high threshold breakdown strength (2.2 MV/cm) and a high thermal conductivity (4.9 W/cm-K), silicon carbide (SiC) is regarded as an ideal material for power switching devices. Therefore, many associated industrialist are dedicated in the development and research of silicon carbide power devices.

For example, the U.S. patent publication No. US2013/0161736 discloses a trench metal oxide semiconductor transistor device and manufacturing method thereof The trench metal includes a substrate of a first conductivity type, a drift region of the first conductivity type, a deep trench doped region of a second conductivity type, an epitaxial region of the second conductivity type, a trench gate, a gate insulating layer, a source region, a drain electrode and a source electrode. The drift region in the first conductivity type has at least one deep trench therein, and the deep trench doped region of the second conductivity type is disposed in the deep trench. The trench gate passes through the epitaxial region of the second conductivity type, and a distance between a bottom of the trench gate and a bottom of the deep trench doped region of the second conductivity type is 0.5 um to 3 um. Accordingly, when the trench metal oxide semiconductor transistor device is operated with a reversed withstand voltage, power line distribution is effectively dispersed to further enhance the reliability of the device.

However, in the above trench metal oxide semiconductor transistor device, a depth of the deep trench doped region of the second type is limited by an energy of ion implantation and a thickness of a hard mask layer. In general, an ion implantation apparatus having a large energy and thus capable of implanting ion implantation exceeding a depth of 2 um in one operation is quite rare. Thus, the development and voltage withstanding capability of the trench metal oxide semiconductor transistor device need to be further improved.

SUMMARY OF THE INVENTION

The primary object of the present invention is to overcome issues of a conventional trench metal oxide semiconductor transistor device. In a conventional trench metal oxide semiconductor transistor device, to effectively disperse power lines and reduce an electric field at a bottom and a corner of a gate, a deep trench doped region is disposed. However, a doped depth of the deep trench doped region suffers from limitations posed by an energy of ion implantation and a thickness of a hard mask layer.

To achieve the above object, a silicon carbide field effect transistor is provided. The silicon carbide field effect transistor includes a silicon carbide substrate, an n-type drift layer, a p-type epitaxy layer, a source region, a trench gate, at least one p-type doped region, a source, a dielectric layer and a drain.

The n-type drift layer is disposed on the silicon carbide substrate. The p-type epitaxy layer is disposed on the n-type drift layer. The source region is formed at the p-type epitaxy layer and away from the n-type drift layer. The trench gate penetrates through the p-type epitaxy layer and extends to the n-type drift layer. The p-type doped region is formed at the n-type drift layer and is adjacent to one lateral side of the trench gate. The source covers the source region and the trench gate. The dielectric layer is disposed between the trench gate and the source. The drain is disposed at the silicon substrate and away from the n-type drift layer.

The p-type doped region includes a first doped block being in contact with the p-type epitaxy layer, and a plurality of second doped blocks arranged at an interval from the first doped block towards the silicon carbide substrate.

In the n-type drift layer of the present invention, the second doped blocks are arranged at an interval from the first doped block towards the silicon carbide substrate. Further, a thickness of the second doped blocks does not exceed 2 um. Accordingly, not only the issue of limitations posed by the energy of ion implantation and the thickness of the hard mask layer is solved, but also power lines are effectively dispersed to reduce the electric field at the bottom and the corner of the trench gate, thereby enhancing the reliability of the silicon carbide field effect transistor.

DETAILED DESCRIPTION OF THE PREFERRED EMBODIMENTS

The foregoing, as well as additional objects, features and advantages of the invention will be more readily apparent from the following detailed description, which proceeds with reference to the accompanying drawings.

Figure 1:
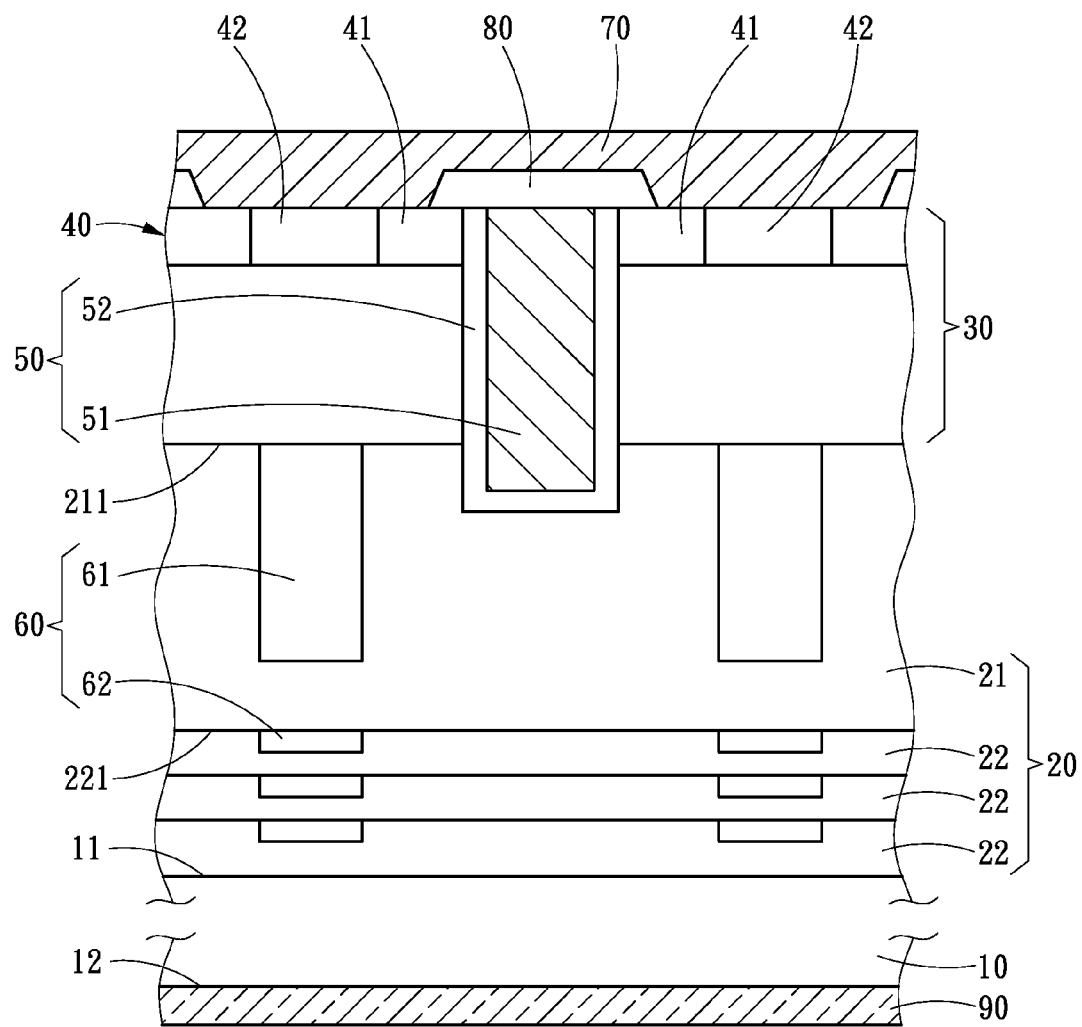
FIG. 1 is a schematic diagram of a structure according to a first embodiment of the present invention.

FIG. 1 shows a schematic diagram of a structure according to a first embodiment of the present invention. A silicon carbide field effect transistor provided by the present invention includes a silicon carbide substrate 10, an n-type drift layer 20, a p-type epitaxy layer 30, a source region 40, a trench gate 50, at least one p-type doped region 60, a source 70, a dielectric layer 80 and a drain 90.

The silicon carbide substrate 10 may be obtained by cutting crystalline silicon carbide into a predetermined thickness or by forming crystalline silicon carbide on any substrate, or may be a commercial silicon carbide substrate 10. Given a substrate having a surface formed with crystalline silicon carbide is utilized, the type of silicon carbide substrate is not limited. The silicon carbide substrate 10 is n-type heavily doped with a doping concentration between $1E18$ $cm^{-3}$ and $5E19$ $cm^{-3}$, and includes an upper surface 11 and a lower surface 12 opposite and away from the upper surface 11.

The n-type drift layer 20 is disposed on the silicon carbide substrate 10 and is located at the upper surface 11. In the embodiment, the n-type drift layer 20 is formed by an epitaxial growth technology, and may be doped by nitrogen or phosphorus with a doping concentration between $1E15$ $cm^{-3}$ and $1E19$ $cm^{-3}$. The n-type drift layer 20 includes a first epitaxy layer 21 and a plurality of second epitaxy layers 22. The first epitaxy layer 21 is away from the silicon carbide substrate 10, and includes a first upper surface 211. The second epitaxy layers 22 are located and stacked between the first epitaxy layer 21 and the silicon carbide substrate 10. Each of the second epitaxy layers 22 includes a second upper surface 221. The p-type epitaxy layer 30 is disposed on the n-type drift layer 20 to be in contact with the first epitaxy layer 21, and is doped by aluminum or boron with a doping concentration between $1E16$ $cm^{-3}$ and $1E19$ $cm^{-3}$.

The trench gate 50 penetrates through the p-type epitaxy layer 30 and extends into the n-type drift layer 20, and includes a gate electrode 51 and a gate insulating layer 52. The gate electrode 51 may be made of a polycrystalline material such as poly-silicon. The gate insulating layer 52 is disposed between the gate electrode 51, the p-type epitaxy layer 30 and the n-type drift layer 20, such that the gate electrode 51, the p-type epitaxy layer 30 and the n-type drift layer 20 are separated and electrically insulated from one another.

The source region 40 is formed at the p-type epitaxy layer 30 at one side away from the n-type drift layer 20, and includes a first source region 41 and a second source region 42. The first source region 41 and the second source region 42 are adjacently disposed, and may be formed by ion implantation. In the embodiment, the first source region 41 is heavily n-type doped, and the second source region 42 is heavily p-type doped. The trench gate 50 also penetrates through the first source region 41 while penetrating through the p-type epitaxy layer 30.

The source 70 covers the source region 40 and the trench gate 50. The drain 90 is disposed at the silicon carbide substrate 10 at one side away from the n-type drift layer 20, and is located at the lower surface 12. Each of the source 70 and the drain 90 may include an ohmic contact layer and a metal layer for electric connection. For example, a material of the ohmic contact layer is nickel or titanium that can form an ohmic contact, and a material of the metal layer may be metal such as copper, aluminum or gold. The dielectric layer 80 is disposed between the trench gate 50 and the source 70, such that the source 70 is electrically insulated from the trench gate 50.

The p-type doped region 60 is formed in the n-type drift layer 20 and is at one side adjacent to the trench gate 50. More importantly, the p-type doped region 60 includes a first doped block 61 and a plurality of second doped blocks 62. The first doped block 61 is correspondingly disposed in the first epitaxy layer 21 and is in contact with the p-type epitaxy layer 30. After growing the epitaxy of the first epitaxy layer 21, the first doped region 61 may be formed by ion implantation, so that the first doped block 61 extends and distributes downwards from the first upper surface 211. The second doped blocks 62 are arranged at an interval from the first doped block 61 towards the silicon carbide substrate 10, and are individually correspondingly formed in the second epitaxy layers 22. After growing the epitaxy of the second epitaxy layers 22, the second doped blocks 62 may be formed by ion implantation, so that the second doped blocks 62 respectively extend downwards from the second upper surfaces 221 of the respective corresponding epitaxy layers 22.

In the embodiment, there are two p-type doped regions 60 respectively located at two opposite lateral sides of the trench gate 50. The first doped block 60 may have a first thickness between 1 um and 4 um, and a first doping concentration between $5E17$ $cm^{-3}$ and $5E19$ $cm^{-3}$; the second doped blocks 62 may have a second thickness between 0.5 um and 1.5 um, and a second doping concentration between $1E16$ $cm^{-3}$ and $2E18$ $cm^{-3}$. Between the first doped blocks 62 and the first doped block 61 is a first distance between 0.3 um and 1.5 um, and between each two of the second doped regions 62 is a second distance between 0.3 um and 1.5 um. The above values of the distances are examples for explaining the present invention rather than limitations to the present invention, and can be adjusted according to actual requirements. Further, it should be noted that, the first thickness and the second thickness may be adjustably controlled by modulating an energy of ion implantation. In general, the energy is between 50 KeV and 1.5 MeV. The first doping concentration and the second doping concentration may be adjustably controlled by modulating a dosage of ion implantation. The dosage may be between $1E12$ $cm^{-2}$ and $1E15$ $cm^{-2}$. Further, the first distance and the second distance are formed by subtracting the first thickness of the first doped block 61 and the second thickness of the second doped blocks 62 from the corresponding first epitaxy layer 21 and second epitaxy layers 22, respectively.

Figure 2:
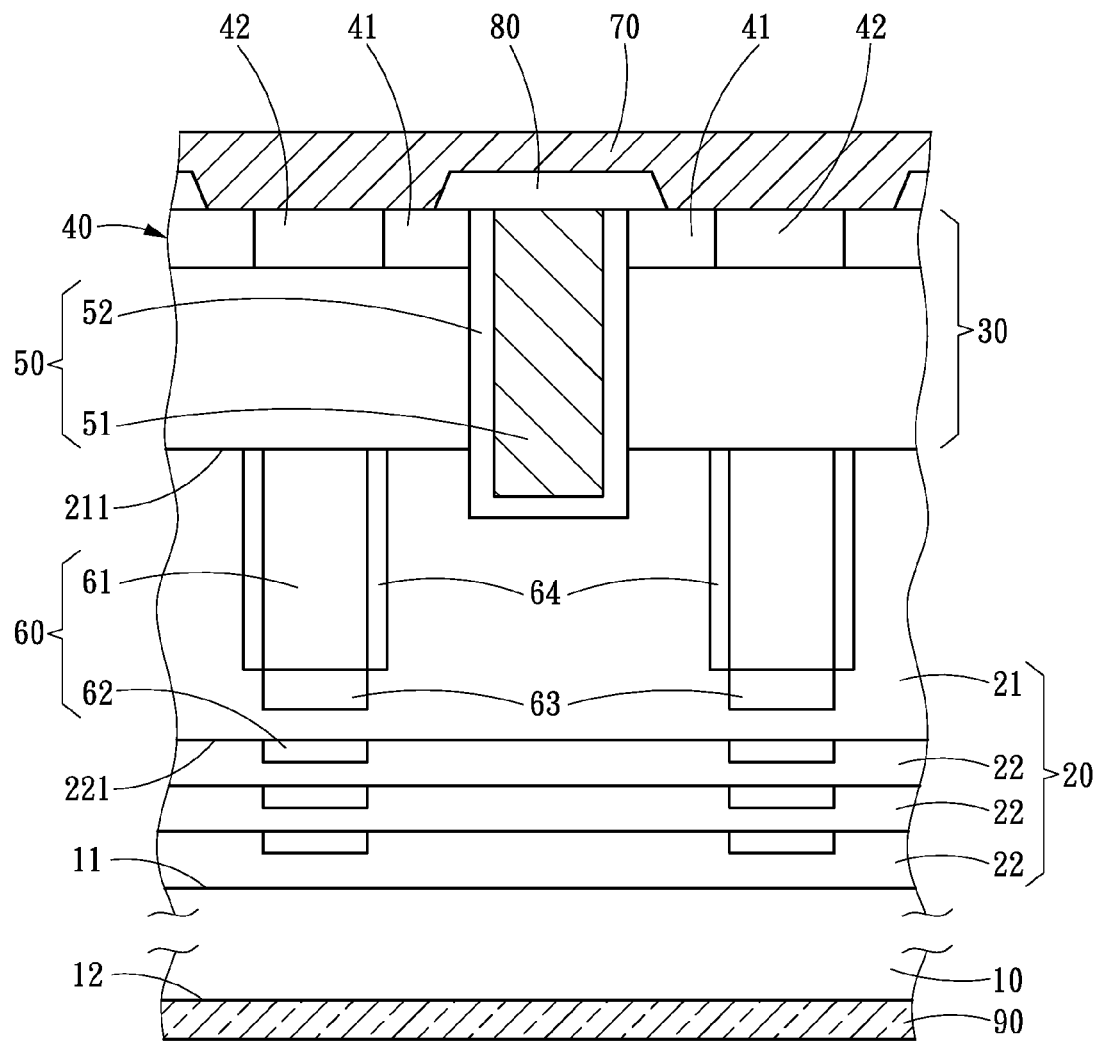
FIG. 2 is a schematic diagram of a structure according to a second embodiment of the present invention.

FIG. 2 shows a schematic diagram of a structure according to a second embodiment. Compared to the first embodiment, a feature of the second embodiment is that, the p-type doped region 60 further includes a heavily doped block 63. The heavily doped block 63 is disposed between the first doped block 61 and the second doped blocks 62 and is connected to the first doped block 61, and has a heavy doping concentration greater than the doping concentrations of the first doped region 61 and the second doped regions 62. The heavy doping concentration is between $1E18$ $cm^{-2}$ and $5E19$ $cm^{-2}$. To form the heavily doped block 63, in the second embodiment, before forming the first doped block 61 in the first epitaxy layer 21, a trench corresponding to a width of the first doped block 61 is first formed, and a lateral gap wall 64 is formed around the trench. For example, a material of the lateral gap wall 64 may be silicon oxide, silicon nitride or another insulating material. Next, the heavily doped block 63 is formed at a bottom of the trench by ion implantation, and the first doped block 61 is then formed at a position of the trench.

In conclusion, in the n-type drift layer of the present invention, the second doped regions are arranged at an interval from the first doped block towards the silicon carbide substrate, and the thickness of the second doped blocks is designed not to exceed 2 um. Thus, only the issue of limitations posed by the energy of ion implantation and the thickness of the hard mask layer is solved, but also power lines are effectively dispersed to reduce the electric field at a bottom and a corner of the trench gate, thereby enhancing the reliability of the silicon carbide field effect transistor. Further, by disposing the heavily doped block at the lateral gap wall of the present invention, a current is allowed to more easily flow laterally when the silicon carbide field effect transistor is conducted, hence reducing a resistance value in a power-on state.

What is claimed is:

1. A silicon carbide field effect transistor, comprising:
   a silicon carbide substrate;
   an n-type drift layer, disposed on the silicon carbide substrate;
   a p-type epitaxy layer, disposed on the n-type drift layer;
   a source region, formed at the p-type epitaxy layer and away from the n-type drift layer;
   a trench gate, penetrating through the p-type epitaxy layer and extending to the n-type drift layer;

at least one p-type doped region, formed at the n-type drift layer and adjacent to a lateral side of the trench gate;

a source, covering the source region and the trench gate;

a dielectric layer, disposed between the trench gate and the source; and a drain, disposed at the silicon carbide substrate and away from the n-type drift layer;

wherein, the p-type doped region comprises a first doped block being in contact with the first p-type epitaxy layer, and a plurality of second doped blocks disposed below the first doped block and arranged along a direction from the first doped block to the silicon carbide substrate, and wherein between each two of the second doped blocks, which are adjacent, is a second distance and the thickness of each second doped block does not exceed 2 um.

2. The silicon carbide field effect transistor of claim 1, wherein the first doped block has a thickness greater than that of the second doped blocks.

3. The silicon carbide field effect transistor of claim 1, wherein the first doped block has a first thickness between 1 um and 4 um.

4. The silicon carbide field effect transistor of claim 1, wherein the second doped blocks have a second thickness between 0.5 um and 1.5 um.

5. The silicon carbide field effect transistor of claim 1, wherein between the second doped blocks and the first doped block is a first distance between 0.3 um and 1.5 um.

6. The silicon carbide field effect transistor of claim 1, wherein the second distance is between 0.3 um and 1.5 um.

7. The silicon carbide field effect transistor of claim 1, wherein the n-type drift layer comprises a plurality of stacked second epitaxy layers and a first epitaxy layer disposed between the second epitaxy layers and the p-type epitaxy layer; the first doped block is formed in the first epitaxy layer, and the second doped blocks are individually correspondingly formed in the second epitaxy layers.

8. The silicon carbide field effect transistor of claim 7, wherein the first epitaxy layer comprises an upper surface, and the first doped block extends and distributes downwards from the first upper surface.

9. The silicon carbide field effect transistor of claim 7, wherein each of the second epitaxy layers comprises a second upper surface, and the second doped blocks respectively extend and distribute downwards in the respective corresponding second epitaxy layers from the respective second upper surfaces.

10. The silicon carbide field effect transistor of claim 1, wherein the first doped block has a first doping concentration between 5E17 $cm^{-3}$ and 5E19 $cm^{-3}$.

11. The silicon carbide field effect transistor of claim 1, wherein the second doped blocks have a second doping concentration between 1E16 $cm^{-3}$ and 2E18 $cm^{-3}$.

12. The silicon carbide field effect transistor of claim 1, wherein the at least one p-type doped region is in a quantity of two, the two p-type doped regions respectively being adjacent to two opposite lateral sides of the trench gate.

13. The silicon carbide field effect transistor of claim 1, wherein the p-type doped region further comprises a heavily doped block, the heavily doped block being disposed between the first doped block and the second doped blocks and being connected to the first doped block.

14. The silicon carbide field effect transistor of claim 1, wherein the trench gate comprises a gate electrode, and a gate insulating layer located between the gate electrode, the p-type epitaxy layer and the n-type drift layer.

* * * * *